(12) United States Patent
Pfeiffer et al.

(10) Patent No.: US 11,193,842 B2
(45) Date of Patent: Dec. 7, 2021

(54) PRESSURE SENSOR ASSEMBLIES WITH PROTECTIVE PRESSURE FEATURE OF A PRESSURE MITIGATION ELEMENT

(71) Applicants: TE Connectivity Solutions GmbH, Steinach (CH); Measurement Specialties, Inc., Hampton, VA (US)

(72) Inventors: Martin Pfeiffer, Neuchâtel (CH); Predrag Drljaca, Neuchâtel (CH); Jean-Francois Le Néal, Neuchâtel (CH); David Eric Wagner, Los Gatos, CA (US); Schahrazède Mouaziz, Boudry (CH)

(73) Assignees: TE CONNECTIVITY SOLUTIONS GMBH, Steinach (CH); MEASUREMENT SPECIALTIES, INC., Hampton, VA (US)

( * ) Notice: Subject to any disclaimer, the term of this patent is extended or adjusted under 35 U.S.C. 154(b) by 420 days.

(21) Appl. No.: 16/434,124

(22) Filed: Jun. 6, 2019

(65) Prior Publication Data
US 2020/0386641 A1 Dec. 10, 2020

(51) Int. Cl.
*G01L 9/00* (2006.01)
*B81C 1/00* (2006.01)
(Continued)

(52) U.S. Cl.
CPC ........ *G01L 9/0045* (2013.01); *B81C 1/00047* (2013.01); *B81C 1/00158* (2013.01);
(Continued)

(58) Field of Classification Search
None
See application file for complete search history.

(56) References Cited

U.S. PATENT DOCUMENTS 5,062,302 A * 11/1991 Petersen ............. G01L 19/0618
73/754
6,886,929 B2 5/2005 Malik et al.
(Continued)

FOREIGN PATENT DOCUMENTS

WO 2013006167 A1 1/2013

OTHER PUBLICATIONS

Extended European Search Report, European Application No. 20177653. 1-1001, European Filing Date, Oct. 16, 2020.

*Primary Examiner* — Andre J Allen
*Assistant Examiner* — Jermaine L Jenkins

(57) ABSTRACT

Pressure sensor assemblies comprise a sensor body having a sensing membrane and wherein a fluid is placed in communication with the membrane to determine a fluid pressure. A support is connected with the body and includes an opening for receiving the fluid from an external source, wherein the opening is in fluid-flow communication with the membrane. The pressure sensor comprises one or more elements disposed therein configured to mitigate transmission of a fluid pressure spike to the sensing membrane. The body or the support may have a pressure mitigating element, e.g., an internal channel, for receiving the fluid from the opening and transferring it to the membrane, wherein the channel may itself be configured to provide the desired protection against fluid pressure spikes, or may be connected with another internal element to provide such protection.

20 Claims, 4 Drawing Sheets

(51) Int. Cl.
 *G01L 19/00* (2006.01)
 *G01L 19/06* (2006.01)

(52) U.S. Cl.
 CPC ...... *G01L 19/0038* (2013.01); *G01L 19/0618* (2013.01); *B81B 2201/0264* (2013.01)

(56) References Cited

U.S. PATENT DOCUMENTS

| | | |
|---|---|---|
| 9,212,054 B1 | 12/2015 | Kwa |
| 11,118,992 B2 * | 9/2021 | Pfeiffer ............... G01L 19/0618 |
| 2005/0139009 A1 | 6/2005 | Flogel et al. |
| 2017/0089792 A1 | 3/2017 | Russell et al. |

* cited by examiner

PRESSURE SENSOR ASSEMBLIES WITH PROTECTIVE PRESSURE FEATURE OF A PRESSURE MITIGATION ELEMENT

FIELD

Pressure sensor assemblies as disclosed herein relate to pressure sensors comprising a sensor membrane or diaphragm in communication with a gas or fluid from an external source being monitored and, more specifically, pressure sensors that provide an improved degree of protection against damage caused by transient fluid pressure events such as high-pressure spiking and the like.

BACKGROUND

The use of pressure sensor assemblies or pressure sensors are known in the art for measuring or monitoring the pressure of fluid from an external source that the pressure sensor is in fluid flow connection with. Conventional pressure sensor assemblies comprise a diaphragm or a membrane that is placed in contact with the fluid, and that is configured having a thin-wall construction for purposes of converting pressure in the fluid to stress or displacement in the diaphragm as fluid pressure is imposed thereon. Typically, such pressure sensors have a port or opening for receiving the fluid from the external source, wherein the fluid is transferred within the pressure sensor to the diaphragm or membrane, and wherein one or more detecting elements may be connected with the diaphragm to measure or take data/receive signals regarding diaphragm movement to thereby determine the fluid pressure.

A problem with such conventional pressure sensors is that the fluid being measured may come from an external source capable of generating transient events of high pressure, e.g., pressure spikes, that when transmitted to the pressure diaphragm or membrane may be outside the design pressures and thereby cause damage to the pressure diaphragm or membrane, i.e., could cause the diaphragm or membrane to flex beyond its designed yield point, and permanently damage the pressure sensor.

In view of such issue, accessory devices referred to in the art as snubber devices have been developed and are constructed as ancillary devices for placement between the external fluid source and the pressure sensor. Such snubber devices are in the form of diaphragms, small orifices or restrictors, or free-moving tubing and operate to mitigate the shock wave of a transient fluid pressure event to reduce or mitigate the shock wave before entering the pressure sensor. However, such ancillary snubber devices add to the overall packaging cost and size of the pressure sensor, as they are external devices, and may not be suited for end-use applications where space for fitment of the installed pressure sensor is at a premium, e.g., such as when used with an engine or powertrain member of a vehicle.

It is, therefore, desired that pressure sensor assemblies be constructed in a manner that provides a desired level of protection against damage from transient fluid pressure transient events, e.g., pressure spikes. It is further desired that such pressure sensor assemblies be constructed in a manner that provides such protection without adding to the overall size of the pressure sensor assembly for packing and placement purposes, and that avoids the need for the above-noted external snubber devices or other external devices.

SUMMARY

Pressure sensor assemblies as disclosed herein generally comprise a sensor body having a sensing membrane or diaphragm disposed within the body, wherein a fluid is placed in communication with the membrane for purposes of determining a pressure of the fluid. A support is connected with the body and includes an opening for receiving the fluid from an external source, wherein the opening is in fluid-flow communication with the membrane. The pressure sensor comprises one or more elements disposed therein that are configured to mitigate transmission of a fluid pressure spike to the sensing membrane to protect the membrane from damage. In an example, one of the body or the support comprises a channel for receiving the fluid from the opening and transferring it to the membrane, wherein the channel may itself be configured to provide the desired protection against fluid pressure spikes, e.g., the channel may include two or more changes in direction within the body or the support or the channel may include one or more changes in dimension. In an example, a portion of the channel extends in a substantially transverse direction relative to one of the support opening and the sensing membrane. In an example, the channel has a series of two or more changes in direction of from about 45 to 150 degrees each. In an example, the channel includes one or more differently sized sections interposed between the support opening and the membrane. The channel may be integral to and disposed within one or both the sensor body and support. In an example embodiment, the channel may be in fluid flow communication with an internal chamber or cavity disposed within the body and/or support that is configured to assist in providing the desired protection against fluid pressure spikes. In an example, the pressure sensor is in the form of an MEMS sensor wherein sensor body is made from silicon and comprises an internal chamber, wherein the sensing membrane is disposed at one end of the chamber, and wherein the support is made from materials selected from the group consisting of silicon and glass. In an example, the pressure sensor comprises one or more electrical sensing elements connected with the membrane for determining fluid pressure from membrane movement.

A method for mitigating pressure spikes in a fluid being monitored by a pressure sensor assembly as disclosed herein comprises receiving fluid to be monitored into an opening in a sensor assembly support. The fluid is transferred from the support to the sensor body comprising the internal chamber and sensing membrane, wherein the sensing membrane is in communication with the fluid. Before the fluid is transferred to the sensing membrane it is treated to reduce a magnitude of a pressure spike in the fluid to protect the sensing membrane from damage. Such treatment may comprise routing the fluid through a channel disposed in one of the support or the body and interposed between the opening and sensing membrane. The channel may be configured as described above and/or may be in fluid flow communication with a second internal chamber or cavity to assist in reducing the magnitude of the fluid pressure spike.

BRIEF DESCRIPTION OF THE DRAWINGS

Pressure sensor assemblies as disclosed herein will now be described by way of example with reference to the accompanying Figures, of which.

DETAILED DESCRIPTION

Figure 1:
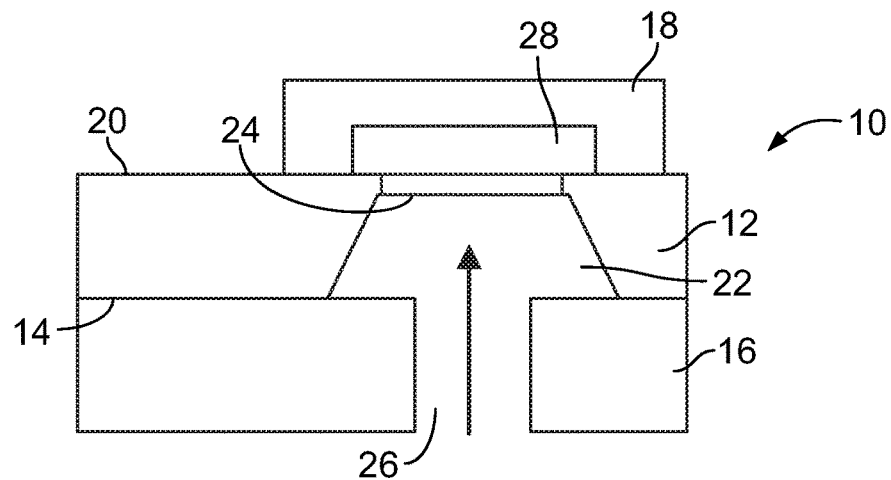
FIG. 1 is a cross-sectional side view of a prior art pressure sensor assembly.

Embodiments of pressure sensor assemblies will be described hereinafter in detail with reference to the attached drawings, wherein like reference numerals refer to the like elements. Pressure sensor assemblies or pressure sensors as disclosed herein may, however, be embodied in many different forms and should not be construed as being limited to the embodiments set forth herein; rather, these embodiments are provided so that the disclosure will be thorough and complete, and will fully convey the concept of pressure sensor assemblies to those skilled in the art.

Pressure sensor assemblies or pressure sensors as disclosed herein generally comprise a sensor body connected with a support or substrate, wherein one of the sensor body or support is specially engineered to include an integral feature or element in the form of a channel that is configured to mitigate a shock wave resulting from a transient fluid pressure event of a fluid that enters the pressure sensor for pressure measurement/monitoring. In an example, pressure sensors as disclosed herein are configured in the form of micro-electrical mechanical systems (MEMS) pressure sensors for monitoring or measuring the pressure of a fluid of an external device, and sending a pressure signal to a remote device such as a controller, processor or the like. A feature of pressure sensors as disclosed herein is that they are constructed comprising a built-in/integral fluid shock mitigating feature, thereby obviating the need to use external snubbers or the like and avoiding the above-noted deficiencies associated therewith. It is to be understood that pressure sensor assemblies as disclosed herein may be used in gas or fluid service. A further feature of such assemblies is that they may be constructed in a manner that helps to protect against damage that may be caused by particles present in fluid that can otherwise directly access the membrane.

FIG. 1 illustrates a prior art MEMS pressure sensor 10 comprising a silicon sensor body 12 that is attached or otherwise bonded by conventional method along a bottom surface 14 to a glass support or substrate 16. The support 16 is configured to facilitate attachment of the pressure sensor to an external fluid source to be monitored or measured through use of a further assembly or housing (not shown) configured to promote such interposed attachment. This example includes a top cover 18 that is formed from glass and that is attached or otherwise bonded by conventional method to an upper surface 20 of the sensor body 12. The sensor body includes an internal chamber 22 and a membrane or diaphragm 24 disposed along one end of the internal chamber and that is configured to move in response to fluid pressure imposed thereon.

Fluid from an external source enters the pressure sensor 10 through a constant diameter opening 26 that passes through the support 16 and that provides continuous unobscured fluid-flow communication with the sensor body internal chamber 22. As the pressure of the fluid entering the pressure sensor changes, this causes the membrane or diaphragm 24 to be moved. The top cover 18 includes a chamber 28 that provides a known reference volume, wherein movement of the diaphragm or membrane resulting from fluid pressure changes cause changes in the reference volume which changes are monitored and measured for purposes of determining therefrom the fluid volume pressure. Such pressure sensors comprise electrical pressure sensing elements, such as piezo-resistive elements or the like, that may be connected with the membrane or with other portions of the sensor for purposes of providing an output signal in response to a change in a property of the sensor in response to fluid pressure Such prior art MEMS pressure sensors as illustrated in FIG. 1 comprise sensing diaphragms or membranes that are designed to operate within defined fluid pressure conditions and yield conditions of the diaphragm or membrane. If the fluid pressure that the pressure sensor is subjected to is outside of the defined conditions, such as during a transient fluid high-pressure event or spike, this could cause the diaphragm or membrane to tear or otherwise be damaged, which would render the pressure sensor unusable. In such prior art pressure sensor 10 the fluid entering the pressure sensor is passed directly through the substrate opening 26, into the pressure sensor internal chamber 22, and into contact with the diaphragm or membrane 24. While there is a slight increase in volume moving from the substrate opening to the sensor body internal chamber, such volume change is not sufficient to mitigate or offset the shock effect on the diaphragm from such a transient fluid high-pressure spike. As noted briefly above, in an effort to address such limitation of prior art pressure sensors, external snubber devices as have been used, wherein such snubber is interposed between the external fluid source and the MEMS pressure sensor.

Figure 2A:
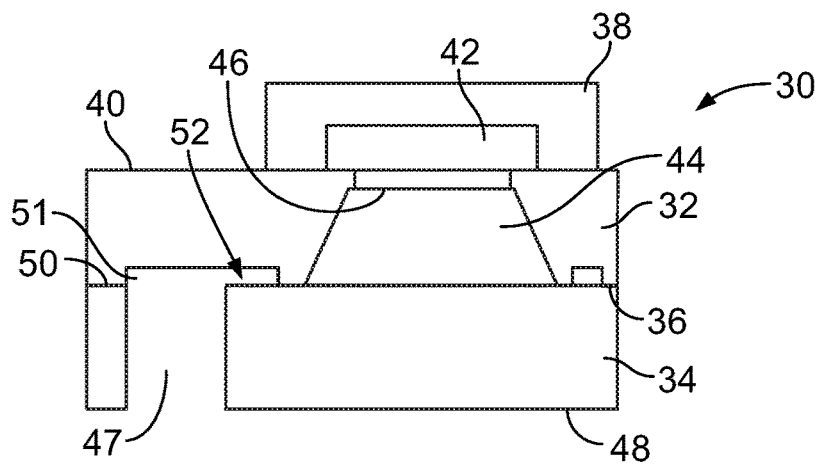
FIGS. 2A and 2B are respective side and top cross-sectional views of an example pressure sensor assembly as disclosed herein.
Figure 2B:
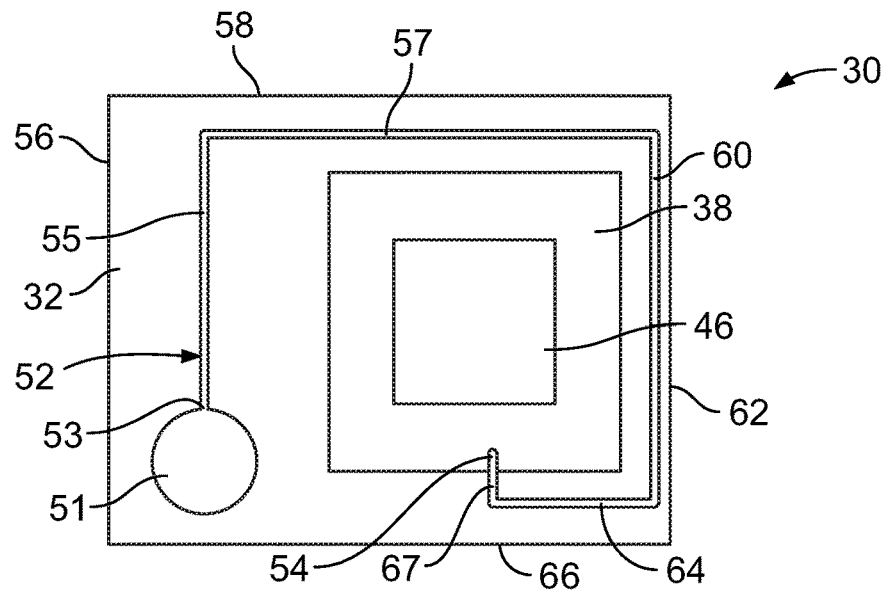

FIGS. 2A and 2B illustrate an example pressure sensor assembly or pressure sensor 30 as disclosed herein. In an example, the pressure sensor is an MEMS sensor comprising a sensor body 32 and a substrate or support 34 attached or bonded with the sensor body along an underside surface 36 of the sensor body. In an example, the sensor body may be formed from silicon and be provided as a silicon wafer, e.g., in the form of single-crystalline silicon or other suitable silicon. The support 34 may be formed from materials having a coefficient of thermal expansion that is similar to the material used to form the sensor body. In an example, the support may be selected from the group including silicon or other materials, such as glass or PYREX, which are chemically inert and can be bonded to the sensor body. In an example, the support 34 is formed from glass.

The pressure sensor 30 includes a top cover or upper support 38 that may be formed from the same types of materials as the support 34 described above and is attached or bonded to the sensor body along an upper surface 40. The upper support 38 includes an internal chamber 42 that is configured to provide a reference volume. The sensor body 32 includes an internal chamber 44 that extends within the body from an interface surface with the support 34 to a sensing diaphragm or membrane 46 positioned at an opposed end of the internal chamber. The diaphragm or membrane 46 is configured to move in response to fluid pressure imposed against the diaphragm or membrane when such fluid is disposed in the internal chamber 44. In an example embodiment, the internal chamber 44 is configured having a conical shape decreasing in diameter moving from the body underside surface 36 to the diaphragm or membrane 46.

The support 34 includes a fluid opening 47 disposed through a thickness of the support as defined between a support bottom surface 48 and a support top surface 50 that is attached to the sensor body 32. The opening 47 in the support may be formed by conventional methods such as machining, etching, molding or the like. In this example, the opening 47 has a continuous diameter, however, it is to be understood that the opening may be configured having a variable diameter if desired. Moving to the sensor body 32, the opening 47 is in fluid flow communication with a sensor body fluid entrance port 51 that is positioned over a top portion of the opening 47. In an example, the entrance port 51 may be configured to complement the opening, e.g., having a diameter that is approximately the same as that of the opening 47.

As best illustrated in FIG. 2B, the sensor body comprises a pressure mitigating element in the form of a channel 52 that extends from one end 53 that is in fluid flow communication with the port 51, to another end 54 that is in fluid flow communication with sensor body internal chamber and sensing membrane 46. In an example, the channel 52 is integral with the sensor body and comprises two more changes in direction within the sensor body. In an example, the channel comprises a series of different sections that each have an angle of departure relative to an adjacent section. In an example, such angle of departure may be about 90 degrees. However, it is to be understood that the configuration of the channel sections and the approximate angle of departure of such sections relative to one another can vary as called for by the particular end-use application.

In an example, the channel is configured to provide a desired mitigation, reduction or elimination of transient fluid pressure effects, such as pressure spikes or the like, to protect the diaphragm or membrane from damage during use. In the particular example illustrated in FIG. 2B, the channel 52 is configured having a diameter that is less than that of the opening 47 to assist in providing the desired mitigation of such transient fluid pressure effects. In an example, the channel 52 may have a cross section that is less than about 10 percent of the opening 47. The opening 47 is sized larger to make alignment achievable given the tolerance of the die attached to a ported package.

The channel 52 in this example embodiment comprises approximately five sections extending between the port 51 and the internal chamber 44, wherein a first section 55 is linear and extends within the sensor body in a direction parallel with and adjacent to a first edge 56 of the body to a connection point with a second section 57. The second channel section has an angle of departure of about 90 degrees relative to the first section and extends in a direction parallel with and adjacent to a second edge 58 of the body to a connection point with a third section 60. The third channel section has an angle of departure of about 90 degrees relative to the second section and extends in a direction parallel with and adjacent to a third edge 62 of the body that is opposite the first edge 56 to a connection point with a fourth section 64. The fourth channel section has an angle of departure of about 90 degrees relative to the third section and extends in a direction parallel with and adjacent to a fourth edge 66 of the body that is opposite the second edge 58 to a connection point with a fifth section 67. The fifth channel section has an angle of departure of about 90 degrees relative to the fourth section and extends in a direction parallel with the body first and third edges 56 and 62 and extends to the sensor body internal chamber. Configured in this manner, the channel 52 extends within the sensor body from the port 51 and around the internal chamber to a connection point with the internal chamber in a manner that mitigates transient fluid pressure events to protect the diaphragm and membrane from unwanted damage. In an example, the length of this channel is optimized to the specific end-use application, as the longer the channel, the slower the response, and the better the pressure spike mitigation.

A feature of this example pressure sensor 30 is that the channel 52 is an integral part of the sensor body 32 that may be formed within the sensor body by a machining process, etch process, deposition process, and the like. While the channel 52 of this example pressure sensor 30 has been illustrated and disclosed as having a constant diameter and a number of interconnected sections, it is to be understood that the channel may be configured having one or more different diameter sections or segments, e.g., where the diameter of one or more channel sections is larger or smaller than other sections.

Further, while the channel sections of this embodiment are illustrated as having a 90 degree angle of departure relative to an adjacent section, it is to be understood that the angle of departure may be different. For example, the angle of departure between different adjacent sections or segments of the channel may be from 45 to 150 degrees, and from 60 to 120 degrees, depending on the particular pressure sensor configuration and the end-use application. Further, as best illustrated in FIG. 2B, the channel 52 and its sections in this example are oriented within the sensor body along a single plane parallel with the underside surface 36. It is to be understood that the channel may be oriented within the body differently as called for by a particular end-use application or construction configuration.

MEMS pressure sensors as disclosed herein including the example disclosed above may be configured to be used with conventional sensing diaphragms or membranes or reference volume measurement elements such as piezo-resistive elements, piezo-conductive elements, contact elements and the like as called for the particular-end use application. In an example embodiment, the MEMS pressure sensor 30 may be configured for use with a piezo-resistive element for purposes of detecting diaphragm or membrane movement and/or change in the reference volume. While the MEMS pressure sensor example illustrated in FIGS. 2A and 2B shows use of a top support and reference volume, such use may be optional in MEMS pressure sensors as disclosed herein.

Figure 3A:
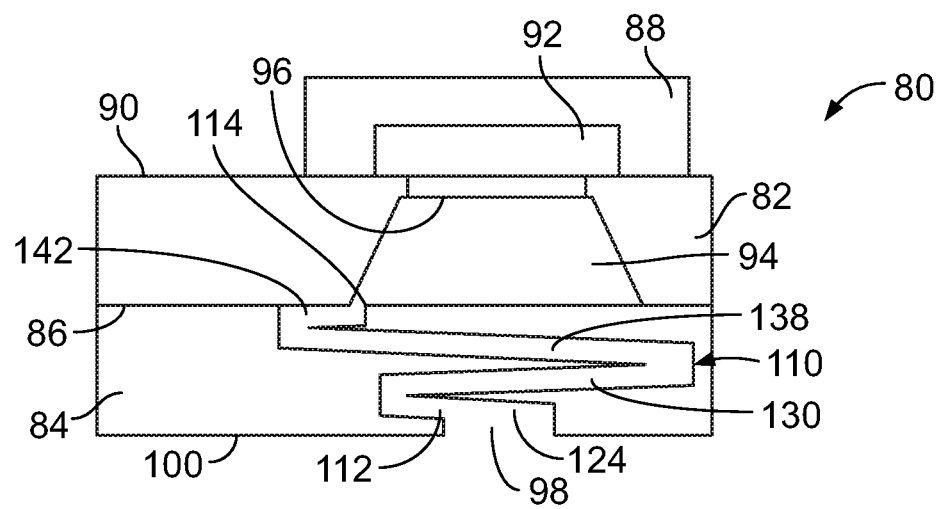
FIGS. 3A and 3B are respective side and top cross-sectional views of an example pressure sensor assembly as disclosed herein.
Figure 3B:
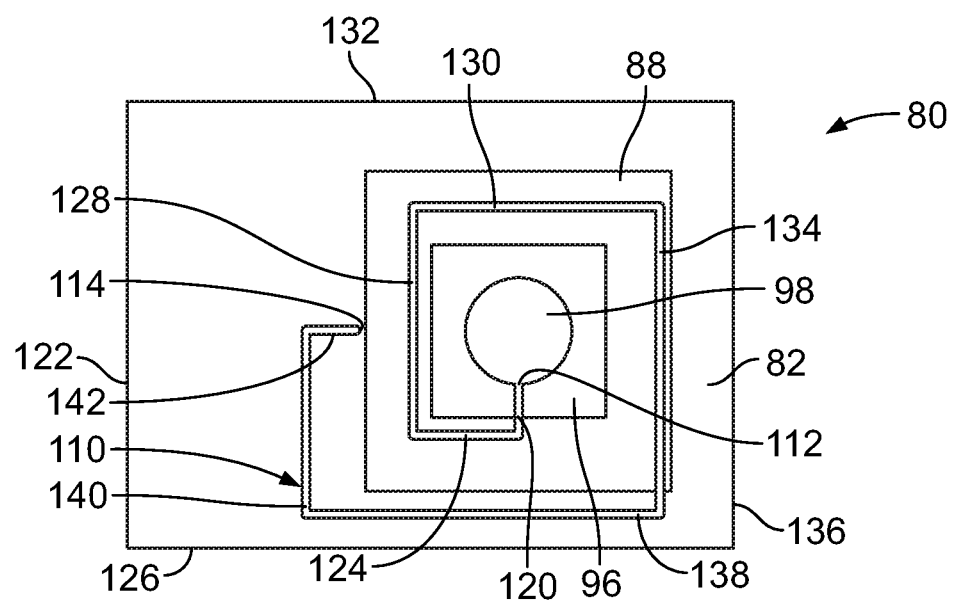

FIGS. 3A and 3B illustrate an example pressure sensor assembly or pressure sensor 80 as disclosed herein. In an example, the pressure sensor is an MEMS pressure sensor comprising a sensor body 82 and a substrate or support 84 attached or bonded with the sensor body along an underside surface 86 of the sensor body. In an example, the sensor body and support may be formed from the same types of materials noted above for the earlier-described pressure sensor example. The pressure sensor 80 includes a top cover or upper support 88 that may be formed from the same types of materials as the support 84 described above and is attached or bonded to the sensor body along an upper surface 90.

The upper support 88 includes an internal chamber 92 that is configured to provide a reference volume. The sensor body 82 includes an internal chamber 94 that extends within the body from an interface surface with the support 84 to a sensing diaphragm or membrane 96 positioned at an opposed end of the internal chamber. The diaphragm or membrane 96 is configured to move in response to fluid pressure imposed against the diaphragm or membrane when such fluid is disposed in the internal chamber 94. In an example embodiment, the internal chamber 94 is configured having a conical shape as described above.

The support 84 includes a fluid opening 98 extending a partial depth from a support bottom surface 100 for receiving an external fluid into the pressure sensor. The opening 98 may be formed by conventional methods such as machining, etching, molding or the like. In this example, the opening 98 has a continuous diameter and extends a partial depth into the support. The exact depth of the opening can vary depending on the particular end-use application, and can be from about 10 to 90 percent, from about 20 to 60 percent, and from about 30 to 50 percent of the total support thickness. In an example embodiment, the opening 98 extends a depth of approximately 15 percent of the total support thickness. While the support fluid opening has been illustrated having a constant diameter, it is to be understood that the opening may be configured having a variable diameter if desired.

A feature of this example pressure sensor 80, as contrasted with that illustrated in FIGS. 2A and 2B, is that the pressure mitigating element or channel for mitigating unwanted transient fluid pressure effects is disposed within the support 84 rather than the sensor body 82. Accordingly, the support 84 comprises a channel 110 that extends from one end 112 that is in fluid flow communication with the opening 98, to another end 114 that is in fluid flow communication with sensor body internal chamber 94. In an example, the channel 110 is integral with the support 84 and comprises two more changes in direction within the support. In an example, the channel 110 comprises a series of different sections that each have an angle of departure relative to an adjacent section. In an example, such angle of departure may be about 90 degrees. However, it is to be understood that the configuration of the channel sections and the approximate angle of departure of such sections relative to one another can vary as called for by the particular end-use application as discussed above.

In an example, the channel 110 is configured to provide a desired mitigation, reduction or elimination of transient fluid pressure effects, such as pressure spikes or the like, to protect the diaphragm or membrane from damage during use. In the particular example illustrated in FIGS. 3A and 3B, the channel 110 is configured having a diameter that is less than that of the opening 98 to assist in providing the desired mitigation of such transient fluid pressure effects. In an example, the channel 110 may have a diameter sized as discussed above for the pressure sensor example of FIGS. 2A and 2B.

The channel 110 comprises approximately eight sections extending between the opening 98 and the sensor body internal chamber 94, wherein a first section 120 is linear and extends within the support 84 in a direction parallel with a first edge 122 of the support to a connection point with a second section 124. The channel second section 124 has an angle of departure of about 90 degrees relative to the first section and extends in a direction parallel with a second edge 126 of the support to a connection point with a third section 128. The channel third section 128 has an angle of departure of about 90 degrees relative to the second section and extends in a direction parallel with and adjacent to the first edge 122 of the support to a connection point with a fourth section 130. The channel fourth section 130 has an angle of departure of about 90 degrees relative to the third section and extends in a direction parallel with and adjacent to a third edge 132 of the support that is opposite the second edge to a connection point with a fifth section 134. The channel fifth section 134 has an angle of departure of about 90 degrees relative to the fourth section and extends in a direction parallel with and adjacent a fourth edge 136 of the support to a connection point with a sixth section 138. The channel sixth section 138 has an angle of departure of about 90 degrees relative to the fifth section and extends in a direction parallel with the second and third edges 126 and 132 of the support to a connection point with a seventh section 140. The channel seventh section 140 has an angle of departure of about 90 degrees relative to the sixth section and extends in a direction parallel with the first edge 122 of the support to a connection point with an eighth section 142. The channel eighth section 142 has an angle of departure of about 90 degrees relative to the seventh section and extends in a direction parallel with the second and third edges 126 and 132 of the support to a connection point with the sensor body internal chamber 94.

As illustrated, the channel 110 is oriented within the support 84 having a pattern that moves concentrically around and inwardly towards the sensor body internal chamber 94. Additionally, FIG. 3A illustrates the upward movement of the channel 110 through the depth of the support 84 from the fluid opening 98 to the sensor body underside surface 86 for entry into the sensor body internal chamber 94. Configured in this manner, the channel 110 extends within the support 84 from the opening 98 and to a connection point with the internal chamber in a manner that mitigates transient fluid pressure events to protect the diaphragm and membrane from unwanted damage.

A feature of this example pressure sensor 80 is that the pressure mitigating element or channel 110 is an integral part of the support 84 that may be formed within the support by a machining process, etch process, deposition process, and the like. While the channel 110 of this example pressure sensor 80 has been illustrated and disclosed as having a constant diameter and a number of interconnected sections or segments, it is to be understood that the channel may be configured having one or more different diameter sections, e.g., where the diameter of one or more channel sections is larger or smaller than other sections. Further, while the channel sections of this embodiment are illustrated as having a 90 degree angle of departure relative to an adjacent section, it is to be understood that the angle of departure may be different as discussed above.

While example pressure sensors discussed above and illustrated in FIGS. 2A, 2B, 3A and 3B relate to pressure sensors having diaphragms or membranes positioned at one end of an inner chamber disposed in the sensor body, it is to be understood that pressure sensor assemblies comprising the features and elements that operate to mitigate transient fluid pressure events to protect the diaphragm or membrane from damage as described herein are not intended to be limited to any one particular pressure sensor construction.

Figure 4:
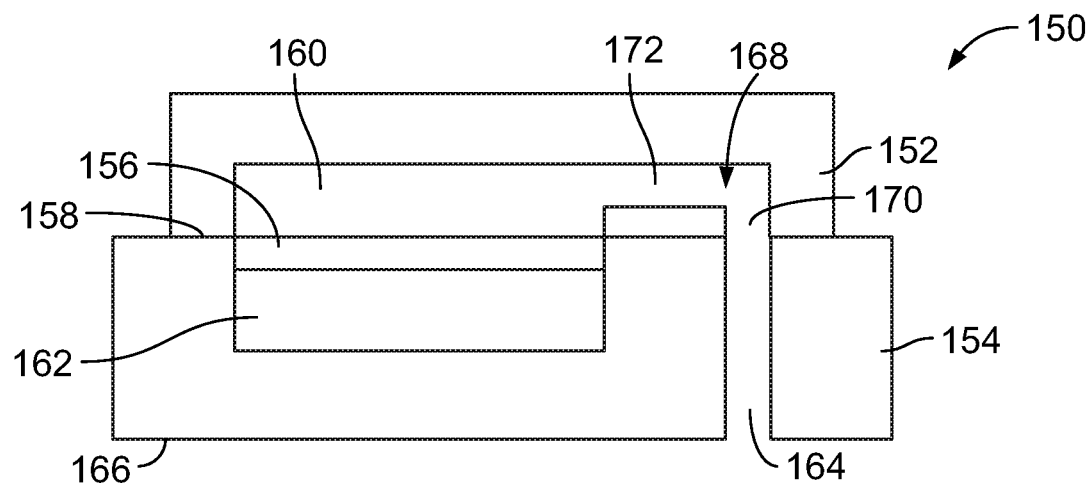
FIG. 4 is a cross-sectional side view of an example pressure sensor assembly as disclosed herein.

FIG. 4 illustrates an example pressure sensor assembly 150 in the form of a buried cavity pressure sensor comprising a sensor body 152 that is attached or bonded to a support 154, wherein the sensor body and support may be formed from the same types of materials discussed above. In this example, a membrane or diaphragm 156 is interposed between an interface 158 of the body and support, wherein the body 152 is configured having an internal chamber or cavity 160 above the membrane 156 and the support 154 is configured having an internal chamber or cavity 162 below the membrane. The body internal cavity 160 is configured to receive a volume of fluid therein from an external source for pressure monitoring and/or measurement, and the support internal cavity 162 is configured to contain a reference volume and/or elements for measuring movement changes of the membrane caused by contact with the fluid being monitored.

The support has an opening 164 that extends through a thickness of the support from an underside surface 166 to the interface 158 with the body. The opening 164 has a constant diameter and is linear in this example. The sensor body 152 comprises a pressure mitigating element in the form of a channel 168 that is positioned in fluid flow communication with the opening 164 and the body internal cavity 160, and that includes two sections; namely, a first section 170 that extends from the opening 164 a partial depth in the body, and a second section 172 that is connected with and that extends from the first section and that has an angle of departure of about 90 degrees relative to the channel first section 170. Thus, a feature of this pressure sensor example is that it includes a channel 168 that is integral with the sensor body 152 and that changes direction in a manner calculated to mitigate a fluid pressure event to protect the membrane 156 from damage.

Figure 5:
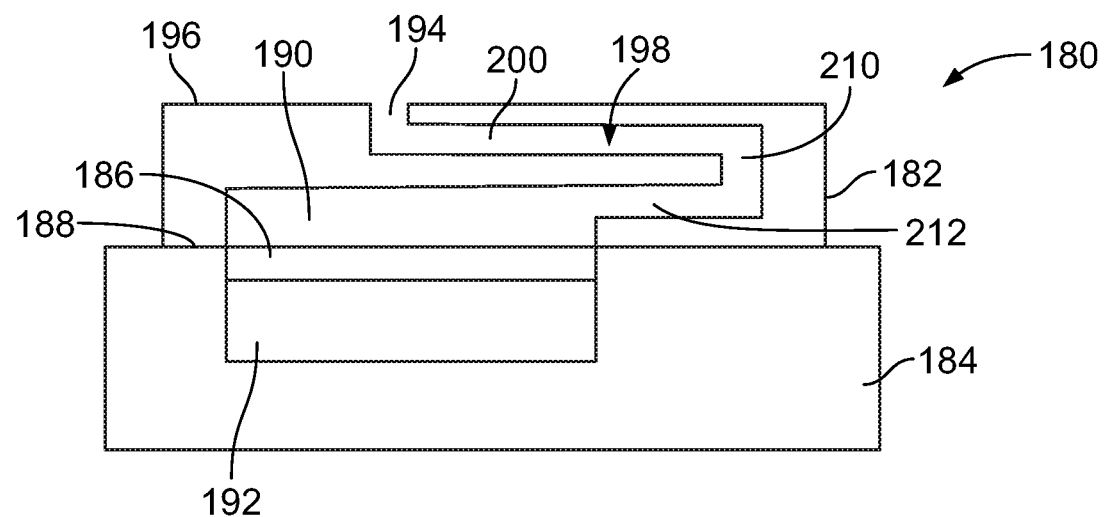
FIG. 5 is a cross-sectional side view of an example pressure sensor assembly as disclosed herein.

FIG. 5 illustrates an example pressure sensor assembly 180 in the form of a buried cavity sensor comprising a sensor body 182 that is attached or bonded to a support 184, wherein the sensor body and support may be formed from the same types of materials discussed above. In this example, a membrane or diaphragm 186 is interposed between an interface 188 of the body and support, wherein the body 182 is configured having an internal chamber or cavity 190 above the membrane 186 and the support 184 is configured having an internal chamber or cavity 192 below the membrane, each provided for the same reasons discussed above with reference to the example pressure sensor of FIG. 4.

Unlike the example pressure sensor of FIG. 4, an opening 194 for receiving fluid from an external source is provided in the sensor body, wherein the opening extends a partial depth from a body top surface 196. A pressure mitigating element in the form of a channel 198 is in fluid flow communication with and extends from the opening 194 to the sensor body internal cavity 190 and is integral with the body. In an example, the channel 198 includes three sections. A first channel section 200 extends a distance from the opening 194 parallel with the top surface 196 to a second section 210 that has an angle of departure relative to the first section of about 90 degrees. The second section 210 extends downwardly into the body in a manner perpendicular to the top surface and connects with a third section 212 that has an angle of departure relative to the second section of about 90 degrees. The channel third section 212 extends parallel to the top surface 196 a distance to the body internal cavity 190. Thus, a feature of this pressure sensor example is that it includes a channel that is integral with the sensor body and that changes direction in a manner calculated to mitigate a fluid pressure event to protect the membrane 186 from damage.

Figure 6:
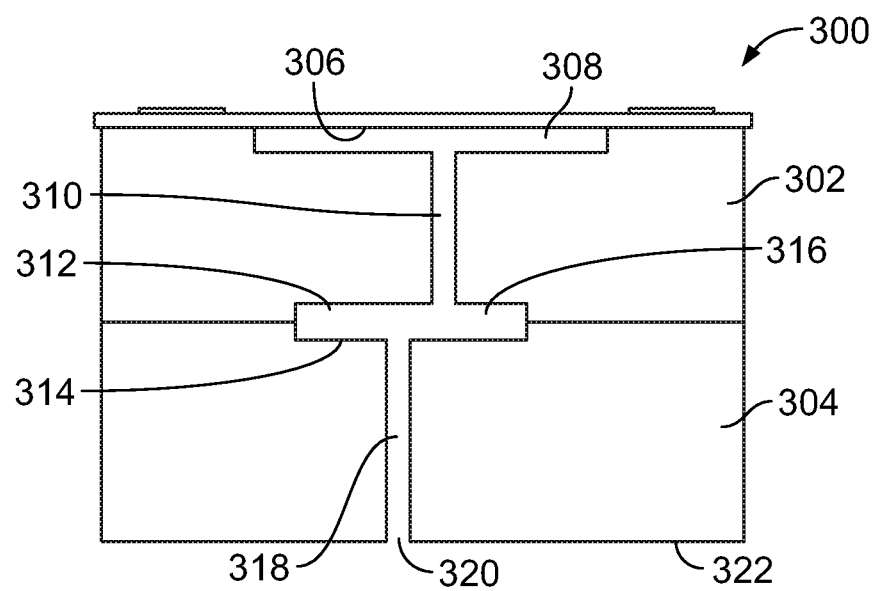
FIG. 6 is a cross-sectional side view of an example pressure sensor assembly as disclosed herein.

FIG. 6 illustrates an example pressure sensor assembly 300 comprising a sensor body 302 that is attached or bonded to a support 304, wherein the sensor body and support may be formed from the same types of materials discussed above. In this example, a diaphragm or membrane 306 may be formed from the sensor body and a horizontal cavity 308 is disposed immediately below the diaphragm for placing an underside portion of the diaphragm in fluid flow communication with fluid that enters the horizontal cavity 308. The sensor body includes a pressure mitigating element in the form of a vertical channel 310 extending through the body from the horizontal cavity 308 to a section 312 of the body that interfaces with the support. In an example, the section 312 may be configured in the form of a horizontal channel or cavity that is positioned adjacent the interface between the body and the support.

In this example, adjacent interfacing sections of the body 312 and the support 314 are each formed having horizontal channel or cavity members that combine to form another pressure mitigating element in the form of a horizontal channel or cavity 316, and in an example a horizontal channel or cavity having an enlarged volume when compared to the vertical channel 310. In this example, a further pressure mitigating element in the form of a vertical channel 318 is in fluid flow communication with the horizontal channel or cavity 316 and extends therefrom through the support 304 to an opening 320 along a bottom surface 322 of the support for receiving inlet of a fluid therein. In an example, the positions where the body vertical channel 312 and the support vertical channel 318 connect with the horizontal channel may be offset for purposes of working with the increased volume of the horizontal channel to further mitigate a fluid pressure event to protect the diaphragm 306 from damage.

While the example illustrated depicts the horizontal channel or cavity 316 as being formed from adjacent interfacing sections of both the body and the support, it is to be understood that the horizontal channel or cavity may be formed in only one section of the body or the support while providing the same desired function and advantages. While not illustrated in FIG. 6, the pressure sensor assembly 300 may include a top cover or upper support as disclosed above in other examples.

Figure 7:
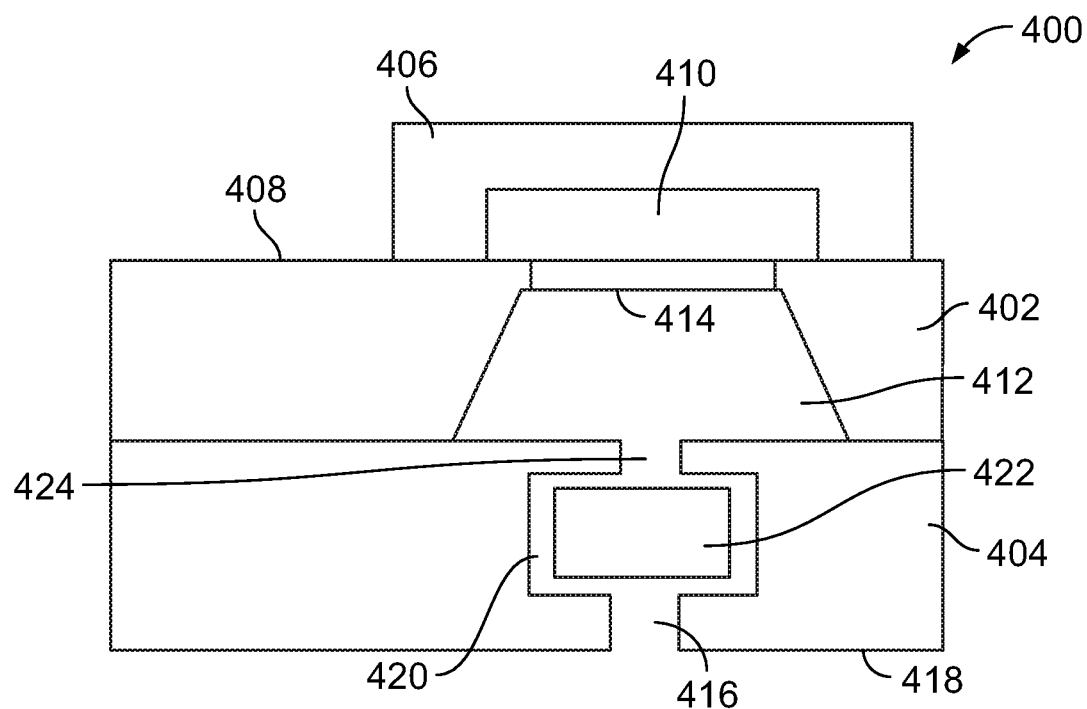
FIG. 7 is a cross-sectional side view of an example pressure sensor assembly as disclosed herein.

FIG. 7 illustrates an example pressure sensor assembly 400 comprising a sensor body 402 that is attached or bonded to a support 404, wherein the sensor body and support may be formed from the same types of materials discussed above. The pressure sensor assembly 400 includes a top cover or upper support 406 that may be formed from the same types of materials as the support 404 described above and is attached or bonded to the sensor body along an upper surface 408. The upper support 406 includes an internal chamber 410 that is configured to provide a reference volume. The sensor body 402 includes an internal chamber 412 that extends within the body from an interface surface with the support 406 to a sensing diaphragm or membrane 414 positioned at an opposed end of the internal chamber. In an example embodiment, the internal chamber 412 is configured having a conical shape as described above.

The support 404 includes a fluid inlet channel 416 that extends a partial depth inwardly from a bottom surface 418 and that receives fluid therein. The inlet channel extends to and is in fluid flow communication with a pressure mitigating element in the form of an internal cavity or chamber 420 having an enlarged diameter and volume relative to the inlet channel 416. Disposed within internal chamber 420 is another pressure mitigating element in the form of a member 422, e.g., a piston or the like, that is configured and formed from a material that enables it to move within the internal chamber in response to a pressure spike in fluid entering from the inlet channel 416. The support further comprises a fluid outlet channel 424 that extends from and is in fluid flow communication with a portion of the internal chamber opposite the inlet channel 416. The outlet channel 424 extends from the internal chamber to an interface surface between the body and support and is positioned over and in fluid flow communication with the sensor body internal chamber 412. In an example, the fluid inlet channel 416 is positioned such that fluid entering the support contacts the member 422 disposed within the internal chamber 420, and the fluid outlet channel 424 is positioned such the movement of the member 422 within the internal chamber in response to spike in fluid pressure causes the member to block passage of fluid into the fluid outlet and to the sensor body. A feature of pressure sensor assemblies as disclosed herein is the construction of the one or more pressure mitigating elements, e.g., such as one or more channels and the like, as an integral part of the pressure sensor assembly itself, and the specific configuration of such one or more elements that may operate independently or together with one another within the pressure sensor assembly to mitigate transient fluid pressure events for protecting the diaphragm or membrane from damage during operation of the pressure sensor.

While certain types and constructions of pressure sensor assemblies have been disclosed and illustrated, it is to be understood that such examples have been provided for purposes of reference and illustration, and that pressure sensor assemblies as disclosed herein should not be limited to the particular embodiments discussed above. Thus, pressure sensor assembly embodiments other than those discussed and illustrated comprising the integral fluid pressure mitigation elements and features as disclosed herein are understood to be within the scope of this description. For example, it is understood that all types of MEMS pressure sensor assemblies comprising diaphragms or membranes exposed to fluid pressure being measured comprising such integral fluid pressure mitigation elements and features are intended to be within the scope of pressure sensor assemblies as disclosed herein and as defined by the following claims.

What is claimed is:

1. A pressure sensor assembly comprising:
    a sensor body comprising a sensing membrane disposed within the body for placing a fluid in communication with the membrane for purposes of determining a pressure of the fluid; and
    a support connected with the body and comprising an opening for receiving the fluid from an external source, wherein the opening is in fluid-flow communication with the membrane;
    wherein one of the body or the support comprises a channel for receiving the fluid from the opening and transferring it to the membrane, and wherein the channel is configured having one or both of a change of direction and a differently sized section for mitigating transmission of a pressure spike to the sensing membrane.

2. The pressure sensor assembly as recited in claim 1, wherein at least a portion of the channel extends in a substantially transverse direction relative to one of the support opening and the sensing membrane.

3. The pressure sensor assembly as recited in claim 1, wherein the channel includes two or more differently sized sections interposed between the support opening and the membrane.

4. The pressure sensor assembly as recited in claim 1, wherein the channel has a series of two or more changes in direction of from about 45 to 150 degrees each.

5. The pressure sensor assembly as recited in claim 1, wherein the channel is integral to and disposed within the sensor body.

6. The pressure sensor assembly as recited in claim 1, wherein the channel is integral to and disposed within the support.

7. The pressure sensor assembly as recited in claim 1, wherein the channel comprises at least two changes in direction and comprises one or more differently sized sections.

8. The pressure sensor assembly as recited in claim 1 in the form of an MEMS sensor wherein the sensor body is made from silicon and comprises an internal chamber, wherein the sensing membrane is disposed at one end of the chamber, and wherein the support is made from materials selected from the group consisting of silicon and glass.

9. The pressure sensor assembly as recited in claim 1 further comprising an electrical sensing element connected with the membrane for determining fluid pressure from membrane movement.

10. A MEMS pressure sensor comprising:
    a sensor body made from silicon and comprising an internal chamber disposed therein and a membrane at an end of the chamber, wherein the body has an interface surface opposite the membrane;
    an electrical sensing element connected with the membrane for determining a pressure of a fluid entering the body and contacting the membrane;
    a support attached to the interface surface of the body and having an opening therein for receiving a fluid to be transferred to the body; and
    a pressure mitigation element disposed between the opening and the membrane and integral with the sensor, the pressure mitigation element comprising a channel having one more changes in direction within the sensor.

11. The MEMS pressure sensor as recited in claim 10, wherein the channel comprises two sections that are oriented about 90 degrees apart from one another.

12. The MEMS pressure sensor as recited in claim 10 wherein the channel includes a section that is sized differently from the opening.

13. The MEMS pressure sensor as recited in claim 12 wherein the channel section is positioned adjacent the opening and is sized smaller than the opening.

14. The MEMS pressure sensor as recited in claim 10 wherein the channel is disposed within the sensor body and comprises two or more direction changes of about 90 degrees or more.

15. The MEMS pressure sensor as recited in claim 10 wherein the channel extends externally around the internal chamber and includes a terminal end that enters an axial end of the internal chamber opposite the membrane.

16. The MEMS pressure sensor as recited in claim 10 wherein the channel includes one or more sections having an expanded volume relative to another section of the channel.

17. A method for mitigating pressure spikes in a fluid being monitored by a pressure sensor assembly comprising the steps of:
    receiving a fluid to be monitored into an opening of a sensor assembly support;
    transferring the fluid from the sensor assembly support to a sensor body that is attached to the support, wherein the sensor body comprises an internal chamber and a sensing membrane connected with the internal chamber, wherein the sensing membrane is in communication with the fluid; and
    treating the fluid within the pressure sensor assembly to reduce a magnitude of a pressure spike in the fluid to protect the sensing membrane from damage, wherein the step of treating comprises routing the fluid through a pressure mitigation element disposed in the sensor between the opening and the sensing membrane.

18. The method as recited in claim 17 wherein the pressure mitigation element is a channel that is integral with the body or the support, and wherein during the step of treating, the fluid is directed through the channel within the body or the support in a direction substantially transverse relative to one of the support opening and the sensing membrane to reduce the magnitude of a pressure spike in the fluid before reaching the membrane.

19. The method as recited in claim 17 wherein during the step of treating, the fluid is directed through the channel in two or more direction changes of about 45 to 150 degrees each.

20. The method as recited in claim 17 wherein the pressure mitigation element is a channel that is integral with the body or the support, and wherein during the step of treating, fluid is directed through one or more differently sized sections of the channel having an expanded volume relative to other sections of the channel to reduce the magnitude of a pressure spike in the fluid before reaching the membrane.

* * * * *